US009257391B2

(12) United States Patent
Bao et al.

(10) Patent No.: US 9,257,391 B2
(45) Date of Patent: Feb. 9, 2016

(54) HYBRID GRAPHENE-METAL INTERCONNECT STRUCTURES

(71) Applicant: GLOBALFOUNDRIES INC., Grand Cayman (KY)

(72) Inventors: Junjing Bao, Cedar Grove, NJ (US); Griselda Bonilla, Fishkill, NY (US); Samuel S. Choi, Beacon, NY (US); Ronald G. Filippi, Wappingers Falls, NY (US); Naftali E. Lustig, Croton on Hudson, NY (US); Andrew H. Simon, Fishkill, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 20 days.

(21) Appl. No.: 13/873,356

(22) Filed: Apr. 30, 2013

(65) Prior Publication Data

US 2014/0319685 A1     Oct. 30, 2014

(51) Int. Cl.
*H01L 21/4763*     (2006.01)
*H01L 21/44*     (2006.01)
(Continued)

(52) U.S. Cl.
CPC .... *H01L 23/53276* (2013.01); *H01L 21/76838* (2013.01); *H01L 23/5283* (2013.01);
(Continued)

(58) Field of Classification Search
CPC ....... H01L 23/48; H01L 21/768; H01L 21/44; H01L 29/78; H01L 21/336; H01L 23/538
USPC .......... 643/618–651; 257/770–774, E21.575, 257/E51.038, E51.039, E51.04; 977/734
See application file for complete search history.

(56) References Cited

U.S. PATENT DOCUMENTS

| 5,470,788 A | 11/1995 | Biery et al. |
| 6,597,067 B1 | 7/2003 | Biery et al. |

(Continued)

FOREIGN PATENT DOCUMENTS

| CN | 102593098 A | 7/2012 |
| JP | 2009267371 A | 11/2009 |

(Continued)

OTHER PUBLICATIONS

Chen et al., "Intrinsic and Extrinsic Performance Limits of Graphene Devices on SiO2", Materials Research Science and Engineering Center, Center for Nanophysics and Advanced Materials, Department of Physics, University of Maryland, 22 pages.
(Continued)

*Primary Examiner* — Yuanda Zhang
*Assistant Examiner* — Sheikh Maruf
(74) *Attorney, Agent, or Firm* — Anthony J. Canale; Hoffman Warnick LLC

(57) ABSTRACT

Hybrid metal-graphene interconnect structures and methods of forming the same. The structure may include a first end metal, a second end metal, a conductive line including one or more graphene portions extending from the first end metal to the second end metal, and one or more line barrier layers partially surrounding each of the one or more graphene portions. The conductive line may further include one or more intermediate metals separating each of the one or more graphene portions. Methods of forming said interconnect structures may include forming a plurality of metals including a first end metal and a second end metal in a dielectric layer, forming one or more line trenches between each of the plurality of metals, forming a line barrier layer in each of the one or more line trenches, and filling the one or more line trenches with graphene.

7 Claims, 14 Drawing Sheets

(51) Int. Cl.
*H01L 23/532* (2006.01)
*H01L 23/528* (2006.01)
*B82Y 40/00* (2011.01)
*B82Y 30/00* (2011.01)
*H01L 21/768* (2006.01)

(52) U.S. Cl.
CPC .............. *B82Y 30/00* (2013.01); *B82Y 40/00* (2013.01); *H01L 21/76831* (2013.01); *H01L 23/53223* (2013.01); *H01L 23/53238* (2013.01); *H01L 23/53252* (2013.01); *H01L 23/53266* (2013.01); *H01L 2924/0002* (2013.01); *Y10S 977/734* (2013.01); *Y10S 977/842* (2013.01); *Y10S 977/932* (2013.01)

(56) References Cited

U.S. PATENT DOCUMENTS

| | | | |
|---|---|---|---|
| 7,259,463 B2 | 8/2007 | Huang et al. | |
| 7,492,046 B2 | 2/2009 | Furukawa et al. | |
| 7,572,682 B2 | 8/2009 | Yang et al. | |
| 7,598,127 B2 | 10/2009 | Whitefield et al. | |
| 7,745,810 B2 | 6/2010 | Rueckes et al. | |
| 7,787,292 B2 | 8/2010 | Keshavarzi et al. | |
| 8,101,529 B2 | 1/2012 | Narita | |
| 8,237,142 B2 | 8/2012 | Cheung et al. | |
| 8,463,090 B2 | 6/2013 | Donval et al. | |
| 8,482,126 B2 | 7/2013 | Wada et al. | |
| 8,647,978 B1 | 2/2014 | Ott et al. | |
| 8,735,242 B2 | 5/2014 | Zhu | |
| 2004/0217481 A1* | 11/2004 | Farrar | 257/758 |
| 2007/0023914 A1 | 2/2007 | Farrar | |
| 2007/0176255 A1 | 8/2007 | Kreupl et al. | |
| 2008/0296728 A1* | 12/2008 | Yang et al. | 257/530 |
| 2010/0021708 A1 | 1/2010 | Kong et al. | |
| 2011/0006425 A1 | 1/2011 | Wada et al. | |
| 2011/0059599 A1 | 3/2011 | Ward et al. | |
| 2011/0091647 A1 | 4/2011 | Colombo et al. | |
| 2011/0101528 A1 | 5/2011 | Akimoto et al. | |
| 2011/0115094 A1 | 5/2011 | Darnon et al. | |
| 2011/0254082 A1* | 10/2011 | Jang | 257/330 |
| 2012/0006580 A1 | 1/2012 | Sandhu | |
| 2012/0080661 A1* | 4/2012 | Saito et al. | 257/29 |
| 2012/0080662 A1 | 4/2012 | Saito et al. | |
| 2012/0080796 A1* | 4/2012 | Wada et al. | 257/762 |
| 2012/0139114 A1 | 6/2012 | Zhang et al. | |
| 2012/0205626 A1 | 8/2012 | Dimitrakopoulos et al. | |
| 2013/0015581 A1* | 1/2013 | Wann et al. | 257/751 |
| 2013/0056873 A1 | 3/2013 | Wada et al. | |
| 2013/0113102 A1* | 5/2013 | Bao et al. | 257/751 |
| 2013/0203222 A1 | 8/2013 | Chung et al. | |
| 2013/0217226 A1* | 8/2013 | Kitamura et al. | 438/652 |
| 2014/0070425 A1* | 3/2014 | Wada et al. | 257/774 |
| 2014/0138829 A1* | 5/2014 | Zhao et al. | 257/746 |

FOREIGN PATENT DOCUMENTS

| | | |
|---|---|---|
| KR | 20070097764 A | 10/2007 |
| WO | 2014099428 A1 | 6/2014 |

OTHER PUBLICATIONS

Pending U.S. Appl. No. 13/716,636, entitled "Graphene and Metal Interconnects", filed on Dec. 17, 2012.

Yu et al., "Bilayer Graphene/Copper Hybrid On-Chip Interconnect: A Reliability Study", IEEE Transactions on Nanotechnology, vol. 10, No. 4, Jul. 2011, pp. 710-714.

Li et al., "Graphene Films with Large Domain Size by a Two-Step Chemical Vapor Deposition Process", NANO Letters, 2010, vol. 10, pp. 4328-4334, American Chemical Society.

Li et al., "Low-Temperature Growth of Graphene by Chemical Vapor Deposition Using Solid and Liquid Carbon Sources", vol. 5, No. 4, pp. 3385-3390, 2011, ACSNANO.

Mattevi et al., "A review of chemical vapour deposition of graphene on copper", www.rsc.org/materials, Journal of Materials Chemistry, 2011, vol. 21, pp. 3324-3334.

Murali et al., "Breakdown current density of graphene nanoribbons", Applied Physics Letters vol. 94, 2009, American Institute of Physics, pp. 243114-1-243114-3.

"New Graphene Fabrication Method uses Silicon Carbide Templates to Create Desired Growth", ScienceNewsline Technology, http://www.sciencenewsline.com/summary/2010100512000020.html, Accessed on Jul. 29, 2014, pp. 1-2.

Pollard, "Growing Graphene via Chemical Vapor Deposition", Department of Physics, Pomona College, May 2, 2011, pp. 1-47.

Yarris, "Graphene Films Clear Major Fabrication Hurdle", Apr. 8, 2010, News Center, http://newscenter.lbl.gov/2010/04/08/graphene-films/, Accessed on Aug. 1, 2014, pp. 1-5.

Robertson et al., "Use of carbon nanotubes for VLSI interconnects", Diamond & Related Materials vol. 18, 2009, pp. 957-962.

Xia et al., "The origins and limits of metal-graphene junction resistance", Nature Nanotechnology, Articles, vol. 6, Mar. 2011, www.nature.com/naturenanotechnology, pp. 179-184.

Sutter et al., "Graphene growth on epitaxial Ru thin films on sapphire"; published online Nov. 23, 2010, doi:10.1063/1.3518490, Copyright 2010 American Institute of Physics.

U.S. Appl. No. 14/454,765, entitled: "Graphene-Metal E-Fuse", filed Aug. 8, 2014.

\* cited by examiner

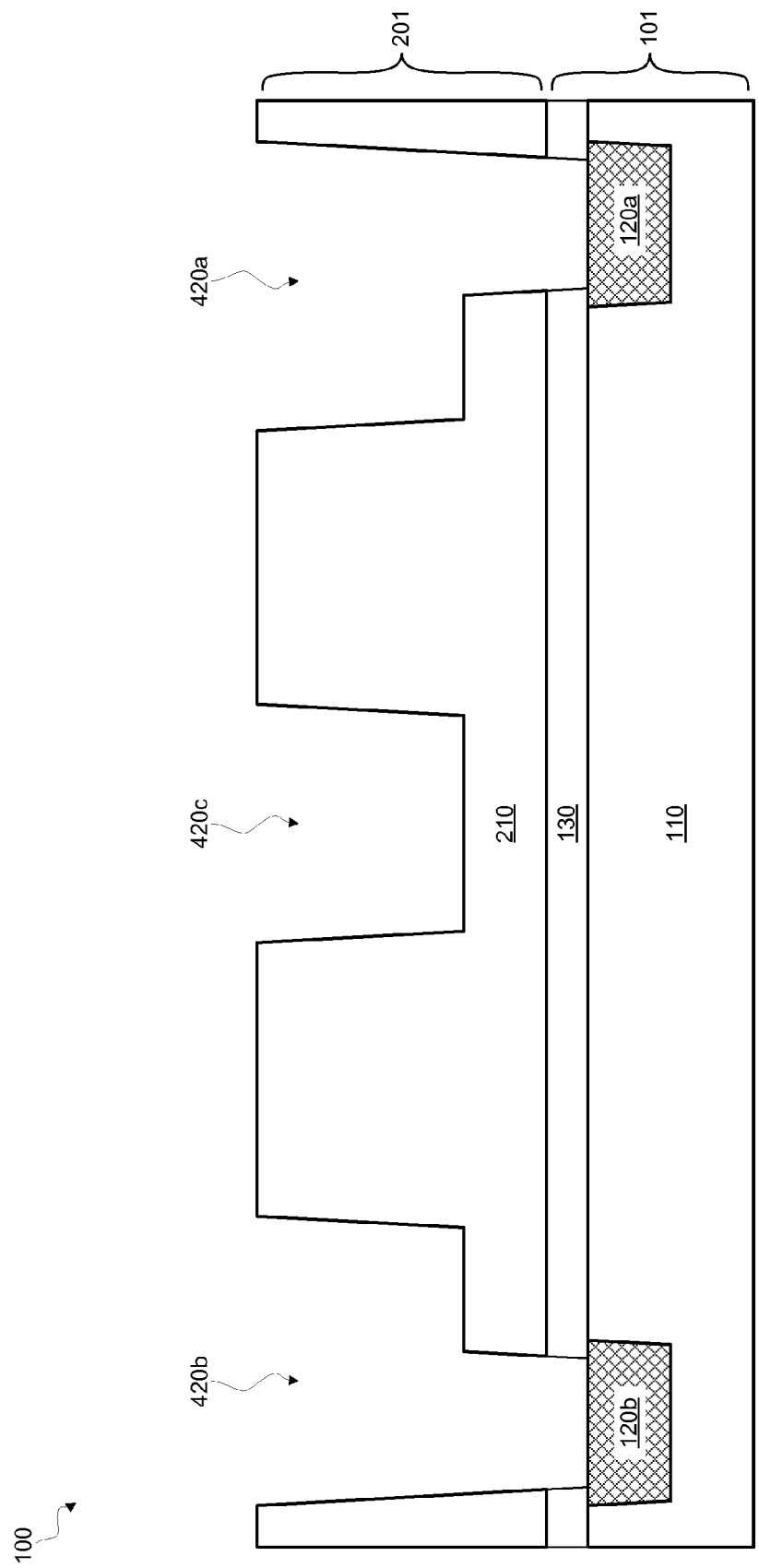

HYBRID GRAPHENE-METAL INTERCONNECT STRUCTURES

BACKGROUND

The present invention generally relates to microelectronic interconnect structures, and particularly to hybrid graphene-metal lines.

Metal interconnect structures are the primary means of connecting microelectronic devices. Such interconnect structures typically take the shape of wires, trenches, or vias formed in dielectric layers above the microelectronic devices and may typically be formed by depositing a dielectric layer, etching a trench in the dielectric layer and filling the trench with a metal, for example copper.

However, as the dimensions of microelectronic devices continue to shrink, metal lines may possess inherent limitations that reduce performance and reliability. For example, the resistivity of metal lines may be too high to effectively transmit current to and from the microelectronic devices. Other materials such a graphene have lower resistivity and can therefore improve device performance. However, graphene presents numerous challenges which discourage its inclusion in typical interconnect structures. Therefore, a method incorporating graphene into metal interconnect structures is desirable.

BRIEF SUMMARY

The present invention relates to hybrid metal-graphene interconnect structures and methods of forming the same. According to an exemplary embodiment, the interconnect structure may include a first end metal, a second end metal, a conductive line including one or more graphene portions extending from the first end metal to the second end metal, and one or more line barrier layers including a barrier material and a graphene seed material partially surrounding each of the one or more graphene portions. The conductive line may further include one or more intermediate metals separating each of the one or more graphene portions.

According to an exemplary embodiment, a hybrid metal-graphene interconnect structure may be formed by forming a plurality of metals including a first end metal and a second end metal in a dielectric layer, forming one or more line trenches between each of the plurality of metals, forming a line barrier layer including a barrier material and a graphene seed material in each of the one or more line trenches, and filling the one or more line trenches with graphene. In some embodiments, the plurality of metals may further include one or more intermediate metals between the first end metal and the second end metal.

According to another exemplary embodiment, a hybrid metal-graphene interconnect structure may be formed by etching in a dielectric layer a first end trench, a second end trench, and one or more intermediate trenches between the first end trench and the second end trench, filling the first end trench, the second end trench, and the one or more intermediate trenches with a plurality of metals, etching a plurality of line trenches in the dielectric layer between each of the plurality of metals, forming a line barrier layer in each of the one or more line trenches, and filling the one or more line trenches with graphene

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 4A is a cross-sectional view depicting forming a first end trench, a second end trench, and an intermediate trench in the $M_{x+1}$ level, according to an exemplary embodiment of the present invention;

Figure 1:
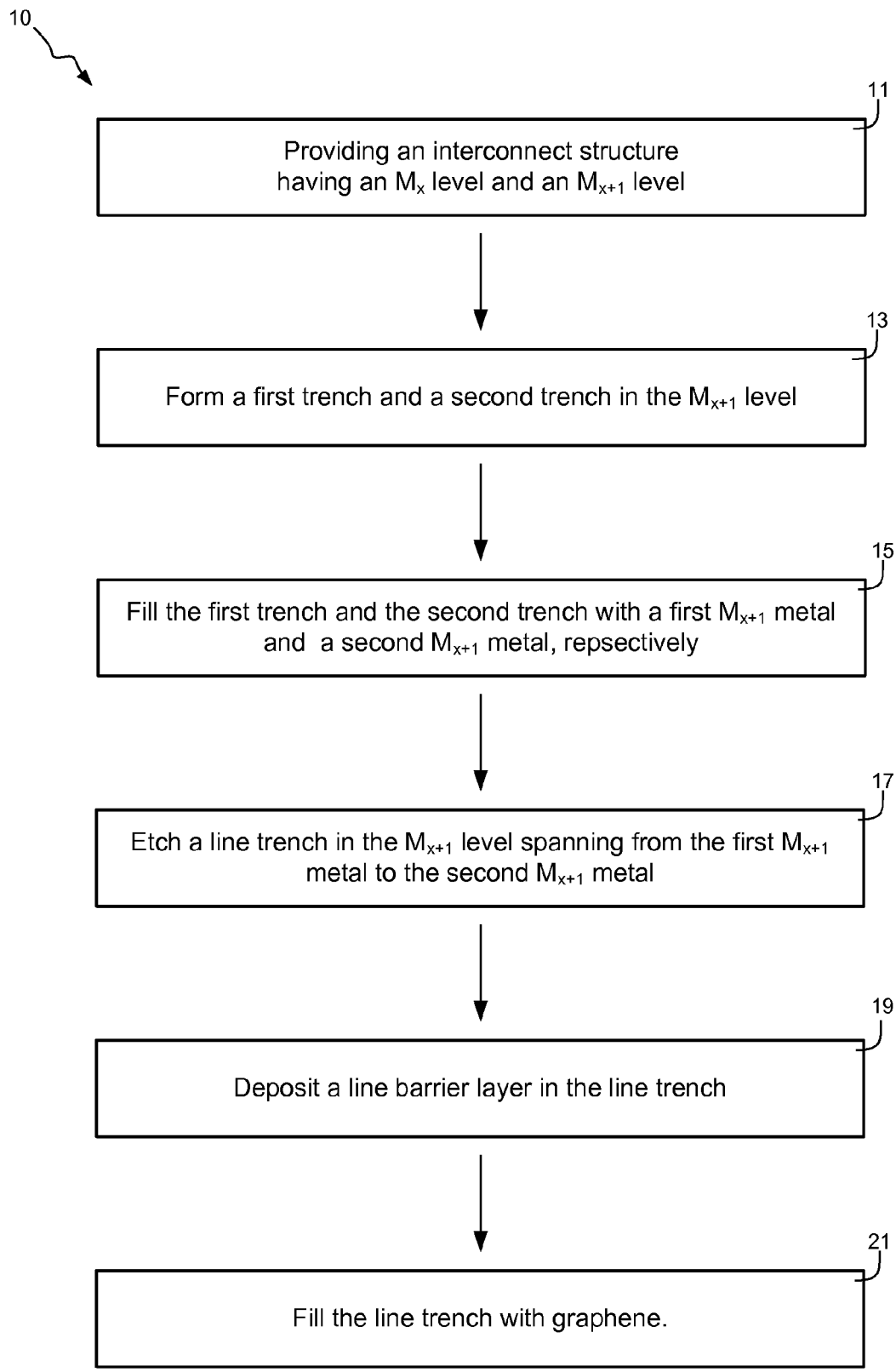
FIG. 1 is a flow chart of a method of forming a hybrid graphene-metal interconnect structure, according to an exemplary embodiment of the present invention.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments will now be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments of the invention generally relate to methods of forming hybrid graphene-metal lines as part of a back-end-of-the-line (BEOL) interconnect level. FIG. 1 is a flow chart of a method of forming a hybrid graphene-metal line, according to an embodiment of the present invention. Referring to FIG. 1, the method 10 includes a step 11, providing an interconnect structure including an $M_x$ level and an $M_{x+1}$ level; a step 13, forming a first trench and a second trench in the $M_{x+1}$ level; a step 15, filling the first trench and the second trench with a first $M_{x+1}$ metal and a second $M_{x+1}$ metal, respectively; a step 17, etching a line trench in the $M_{x+1}$ level spanning from the first $M_{x+1}$ metal to the second $M_{x+1}$ metal; a step 19, depositing a line barrier layer in the line trench; and a step 21, filling the line trench with graphene.

Figure 2A:
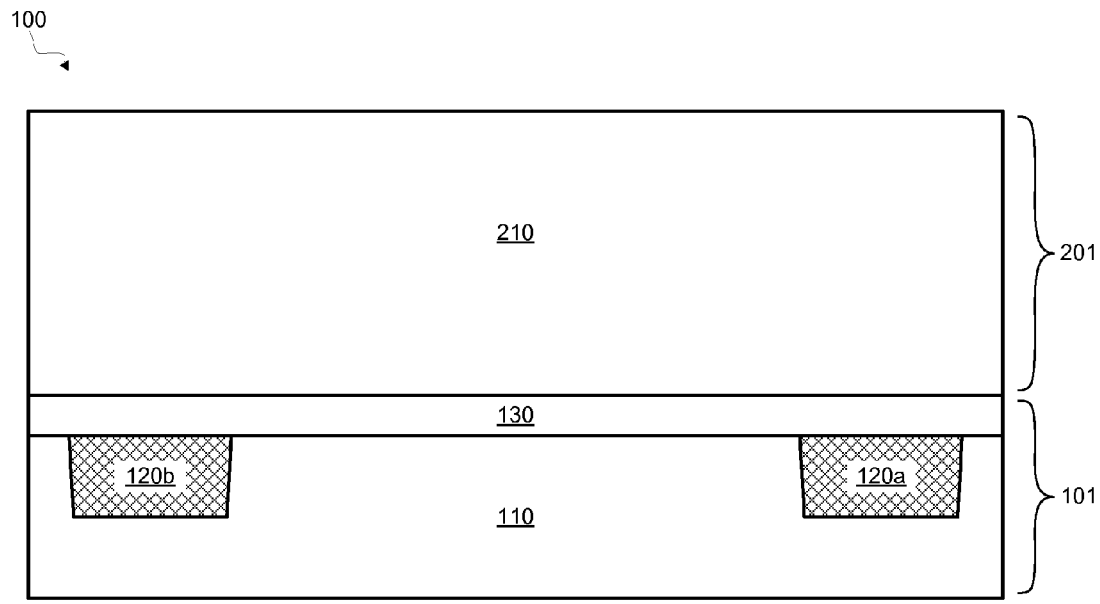
FIG. 2A is a cross-sectional view of an interconnect structure having an $M_x$ level including an $M_x$ dielectric, a first $M_x$ metal, a second $M_x$ metal, and an $M_x$ capping layer, and an $M_{x+1}$ level including an $M_{x+1}$ dielectric, according to an exemplary embodiment of the present invention.

At 11, described in conjunction with FIG. 2A, an interconnect structure 100 may be provided. The interconnect structure 100 may include an $M_x$ level 101 and an $M_{x+1}$ level 201. The $M_x$ level 101 and the $M_{x+1}$ level 201 may be any adjacent interconnect levels in the interconnect structure 100. It should be noted that while only two interconnect levels are shown, the interconnect structure 100 may include multiple interconnect levels below the $M_x$ level 101. The $M_x$ level 101 may include an $M_x$ dielectric 110, a first $M_x$ metal 120a, a second $M_x$ metal 120b, and an $M_x$ capping layer 130. In some embodiments, the $M_x$ level 101 may not include the first $M_x$ metal 120a and/or the second $M_x$ metal 120b. The $M_{x+1}$ level 201 may include an $M_{x+1}$ dielectric 210.

With continued reference to FIG. 2A, The $M_x$ dielectric 110 may include any suitable dielectric material, for example, silicon oxide, silicon nitride, hydrogenated silicon carbon oxide, silicon based low-k dielectrics, porous dielectrics, or organic dielectrics including porous organic dielectrics. The $M_x$ dielectric 110 may be formed using known suitable deposition techniques, such as, for example, atomic layer deposition (ALD), chemical vapor deposition (CVD), plasma enhanced chemical vapor deposition, spin on deposition, or physical vapor deposition (PVD). The $M_x$ dielectric 110 may have a thickness ranging from approximately 70 nm to approximately 140 nm, although greater and lesser thicknesses are explicitly contemplated.

With continued reference to FIG. 2A, the first $M_x$ metal 120a and the second $M_x$ metal 120b may be, for example, typical lines, vias, or wires found in a typical interconnect structure. The first $M_x$ metal 120a and the second $M_x$ metal 120b may be made of a conductive interconnect material including, for example, copper, aluminum, or tungsten. The conductive interconnect material may be formed using a filling technique such as electroplating, electroless plating, chemical vapor deposition, physical vapor deposition or a combination of methods. The conductive interconnect material may further include a dopant, such as, for example, manganese, magnesium, copper, aluminum, or other known dopants. In some embodiments, various barriers or liners (not shown) may be formed in the $M_x$ level 101 between first $M_x$ metal 120a and the $M_x$ dielectric 110 and between second $M_x$ metal 120b and the $M_x$ dielectric 110. In one embodiment, a liner may include, for example, a tantalum nitride layer, followed by a tantalum layer. Other barrier liners may include manganese, cobalt or ruthenium, either alone or in combination with any other suitable liner.

With continued reference to FIG. 2A, the $M_x$ capping layer 130 may include, for example, silicon nitride, silicon carbide, silicon carbon nitride, hydrogenated silicon carbide, or other known capping materials. The $M_x$ capping layer 130 may have a thickness ranging from approximately 20 nm to approximately 60 nm and ranges there between, although greater and lesser thicknesses are explicitly contemplated.

With continued reference to FIG. 2A, the $M_{x+1}$ dielectric 210 may be substantially similar to the $M_x$ dielectric 110 described above and may be formed by similar known deposition techniques. Because a portion of the $M_{x+1}$ dielectric 210 may be removed during subsequent fabrication steps, the $M_{x+1}$ dielectric 210 may have an initial thickness greater than desired in the ultimate structure. In some embodiments, the $M_{x+1}$ dielectric 210 may have an initial thickness ranging from approximately 90 nm to approximately 200 nm, although greater and lesser thicknesses are explicitly contemplated.

Figure 2B:
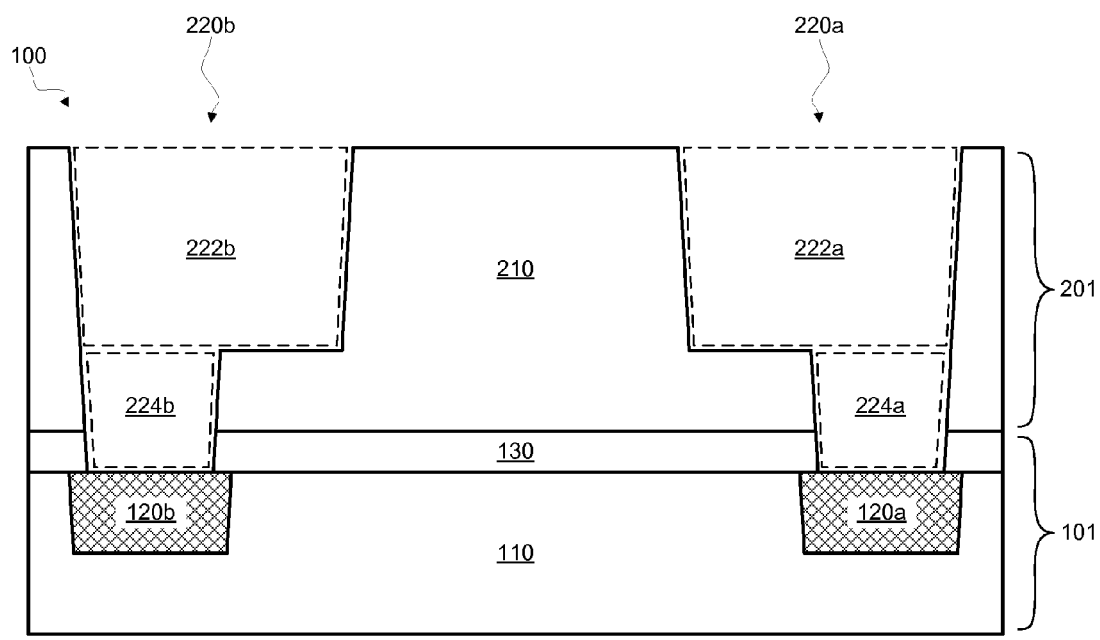
FIG. 2B is a cross-sectional view depicting forming a first trench and a second trench in the $M_{x+1}$ level, according to an exemplary embodiment of the present invention.

At 13, described in conjunction with FIG. 2B, a first trench 220a and a second trench 220b may be formed in the $M_{x+1}$ level 201. The first trench 220a and the second trench 220b may be formed using a dual damascene process. The first trench 220a may include a via portion 224a and a line portion 222a and the second trench 220b may include a via portion 224b and a line portion 222b. Via portions 224a and 224b may be formed through the $M_x$ capping layer 130 to expose a portion of the first $M_x$ metal 120a and the second $M_x$ metal 120b, respectively. In some embodiments, via portions 224a and/or 224b may be absent. Line portions 222a and 222b may have a depth ranging from approximately 50 nm to approximately 160 nm, although greater and lesser thicknesses are explicitly contemplated. Because a portion of line portions 222a and 222b may be removed during subsequent fabrication steps, Line portions 222a and 222b may have an initial depth greater than desired in the ultimate structure.

Figure 2C:
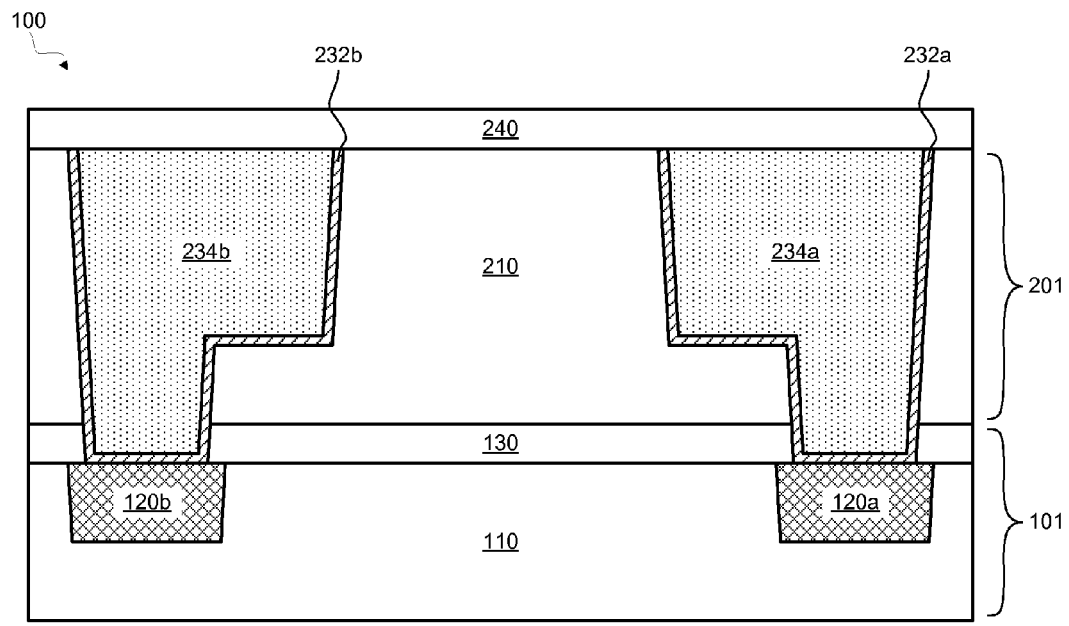
FIG. 2C is a cross-sectional view depicting forming a first $M_{x+1}$ metal in the first trench of the $M_{x+1}$ level, a second $M_{x+1}$ metal in the second trench of the $M_{x+1}$ level, and an $M_{x+1}$ capping layer above the $M_{x+1}$ dielectric, according to an exemplary embodiment of the present invention.

At 15, described in conjunction with FIG. 2C, a first $M_{x+1}$ metal 234a and a second $M_{x+1}$ metal 234b may be formed in the first trench 220a and the second trench 220b, respectively. The first $M_{x+1}$ metal 234a and the second $M_{x+1}$ metal 234b may be made of a conductive interconnect material, including, for example, gold, copper, aluminum, or tungsten, and may be formed using a filling technique such as electroplating, electroless plating, chemical vapor deposition, physical vapor deposition or a combination of methods. The conductive interconnect material may further include a dopant, such as, for example, manganese (Mn), magnesium (Mg), copper (Cu), aluminum (Al) or other known dopants.

With continued reference to FIG. 2C, liners 232a and 232b may be formed in the first trench 220a and the second trench 220b, respectively, using typical deposition techniques, such as CVD or ALD, prior to forming the first $M_{x+1}$ metal 234a and the second $M_{x+1}$ metal 234b. Liners 232a and 232b layer may include typical interconnect barrier materials, such as tantalum, tantalum nitride, and combinations thereof or titanium, titanium nitride and combinations thereof. Other liner materials may include manganese, cobalt or ruthenium, either alone or in combination with any other suitable liner. In other embodiments the thin liner layer may be a silicon nitride or SiNCOH layer. Liners 232a and 232b may have a thickness ranging from approximately 1 nm to approximately 10 nm, although greater and lesser thicknesses are explicitly contemplated.

With continued reference to FIG. 2C, a sacrificial protective layer 240 may be formed above the $M_{x+1}$ level 201. While the sacrificial protective layer 240 may be excluded in some embodiments, it may be included to at least protect the first $M_{x+1}$ metal 234a and the second $M_{x+1}$ metal 234b during subsequent processing steps. In some embodiments, the sacrificial protective layer 240 may be substantially similar to the $M_x$ capping layer 130 and be formed using similar methods. In other embodiments, any suitable protective layer may be used.

Figure 2D:
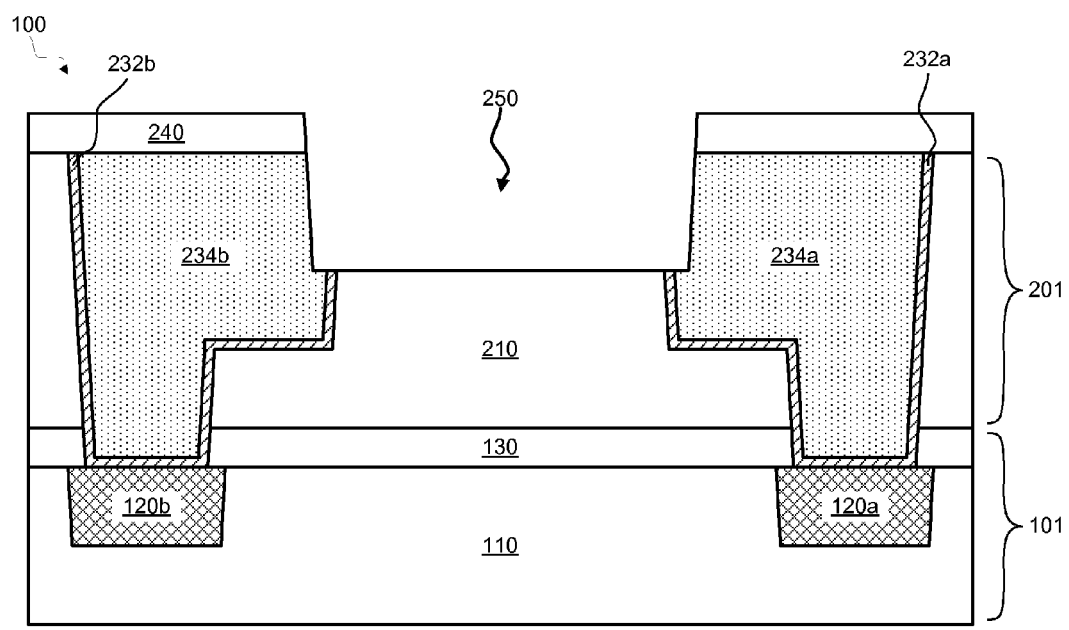
FIG. 2D is a cross-sectional view depicting etching a $M_{x+1}$ line trench in the $M_{x+1}$ level, according to an exemplary embodiment of the present invention.

At 17, described in conjunction with FIG. 2D, a line trench 250 may be formed in the $M_{x+1}$ level 201 between the first $M_{x+1}$ metal 234a and the second $M_{x+1}$ metal 234b. The line trench 250 may span the distance between the first $M_{x+1}$ metal 234a and the second $M_{x+1}$ metal 234b so that the line trench 250 exposes a portion of the first $M_{x+1}$ metal 234a and the second $M_{x+1}$ metal 234b. In an alternate embodiment, the line trench 250 may be etched so that a portion of the liners 232a and 232b may be preserved between the line trench 250 and the first $M_{x+1}$ metal 234a and the second $M_{x+1}$ metal 234b. The line trench 250 may have a depth ranging from approximately 25 nm to approximately 80 nm, measured from the top surface of the dielectric layer 210, although greater and lesser depths are explicitly contemplated. The line trench 250 may be formed by any suitable anisotropic etching technique, including, for example, reactive ion etching (RIE) or plasma etching. Exemplary etching techniques may be fluorine-based, including, for example, $CF_4$ plasma etching.

Figure 2E:
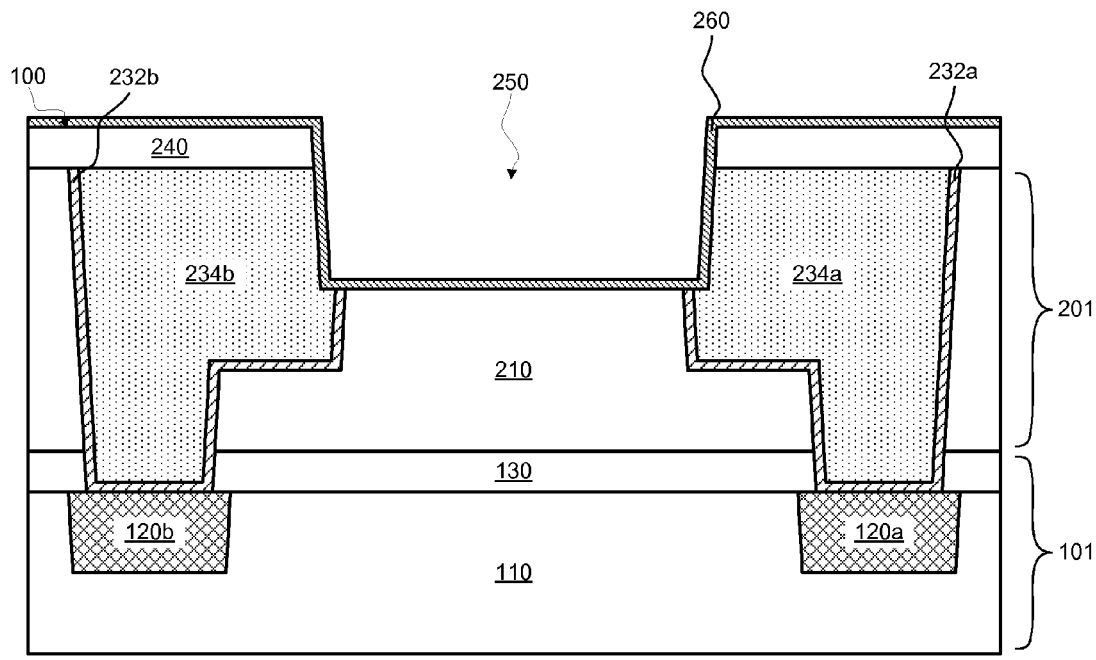
FIG. 2E is a cross-sectional view depicting depositing a line barrier layer in the $M_{x+1}$ line trench, according to an exemplary embodiment of the present invention.
Figure 2F:
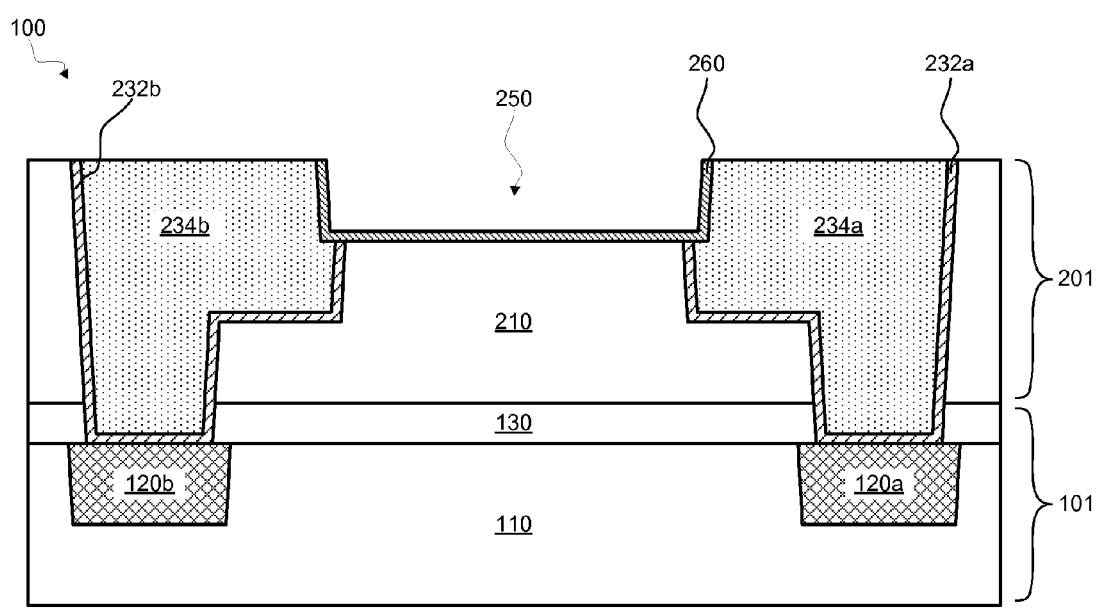
FIG. 2F is a cross-sectional view depicting planarizing the $M_{x+1}$ level, according to an exemplary embodiment of the present invention.

At 19, described in conjunction with FIG. 2E-2F, a line barrier layer 260 may be formed in the line trench 250. Referring to FIG. 2E, the line barrier layer 260 may include a barrier material and a graphene seed material. The barrier material may improve adherence of the graphene seed material to the sidewalls of the line trench 250 while also serving as an electromigration barrier between the graphene line to be subsequently formed in the line trench 250 and the first $M_{x+1}$ metal 234a and the second $M_{x+1}$ metal 234b. Exemplary barrier materials include the materials of the liners 232a and 232b, including tantalum, tantalum nitride, and combinations thereof or titanium, titanium nitride and combinations thereof. The graphene seed material may be any material capable of aiding the formation of the graphene line to be subsequently formed in the line trench 250. In an exemplary embodiment, the graphene seed material may be ruthenium. Alternatively, the graphene seed material may include ruthenium, nickel, palladium, iridium, copper, or any combination thereof. The most appropriate graphene seed material may depend on the specific graphene deposition or growth process used.

Referring to FIG. 2F, the $M_{x+1}$ level 201 may be planarized using, for example, chemical-mechanical planarization (CMP) to remove excess material from the line barrier layer 260 and the sacrificial protective layer 240. The CMP process may use the first $M_{x+1}$ metal 234a and the second $M_{x+1}$ metal 234b as a planarization stop, though some amount of over-polishing, resulting in removal of a top portion of first $M_{x+1}$ metal 234a and the second $M_{x+1}$ metal 234b, may be acceptable. After planarization, the depth of the line trench 250 may be reduced to approximately 2 nm to approximately 5 nm, including the thickness of the line barrier layer 260, although greater and lesser depths are explicitly contemplated.

Figure 2G:
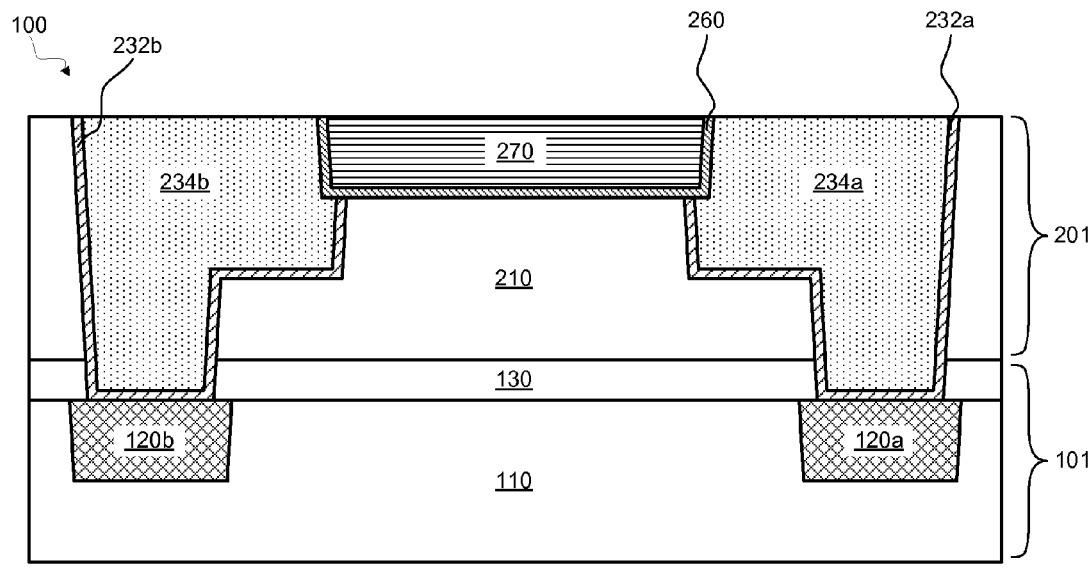
FIG. 2G is a cross-sectional view depicting filling the $M_{x+1}$ line trench with graphene, according to an exemplary embodiment of the present invention.

At 21, described in conjunction with FIG. 2G, a graphene line 270 may be formed in the line trench 250, so that the graphene line 270 abuts and is electrically connected to the first $M_{x+1}$ metal 234a and the second $M_{x+1}$ metal 234b while being separated from the first $M_{x+1}$ metal 234a and the second $M_{x+1}$ metal 234b by the line barrier layer 260. The graphene line 270 may be formed using any method known in the art capable of forming a graphene region that conducts electricity between the first $M_{x+1}$ metal 234a and the second $M_{x+1}$ metal 234b. In an exemplary embodiment, the graphene line 270 may include multilayer graphene deposited using CVD with either solid or liquid precursors at a temperature between approximately 300° C. and approximately 400° C., although greater and lesser temperatures are explicitly contemplated. It may be preferable to use a graphene formation process within this temperature range or lower to avoid damage to other elements of the interconnect structure 100 or any underlying microelectronic devices (not shown). However, graphene formation processes that require higher temperatures may also be acceptable.

With continued reference to FIG. 2G, the graphene line 270 electrically connects the first $M_{x+1}$ metal 234a and the second $M_{x+1}$ metal 234b. In other embodiments where the graphene line 270 is made of multi-layer graphene, current may travel from one graphene layer into another. However, there is generally higher electrical resistance between individual graphene layers. Therefore, current may travel primarily in a direction parallel to the length of the graphene line 270.

After forming the graphene line 270, an $M_{x+1}$ capping layer (not shown) and an $M_{x+2}$ dielectric layer (not shown) may be deposited above the $M_{x+1}$ dielectric layer and the process described above in conjunction with FIGS. 2B-2G may be repeated to form an $M_{x+2}$ level containing an additional hybrid graphene metal line. Due to the material properties of the graphene line 270, it may be difficult to form a reliable electrical connection directly to the graphene line 270. However, because both ends of the graphene line 270 are attached to a metal structure (i.e., the first $M_{x+1}$ metal 234a and the second $M_{x+1}$ metal 234b), it may be possible to avoid making any electrical connections to the graphene line 270. Instead, electrical connections from the $M_{x+2}$ level may be made to the first $M_{x+1}$ metal 234a and the second $M_{x+1}$ metal 234b.

Figure 2H:
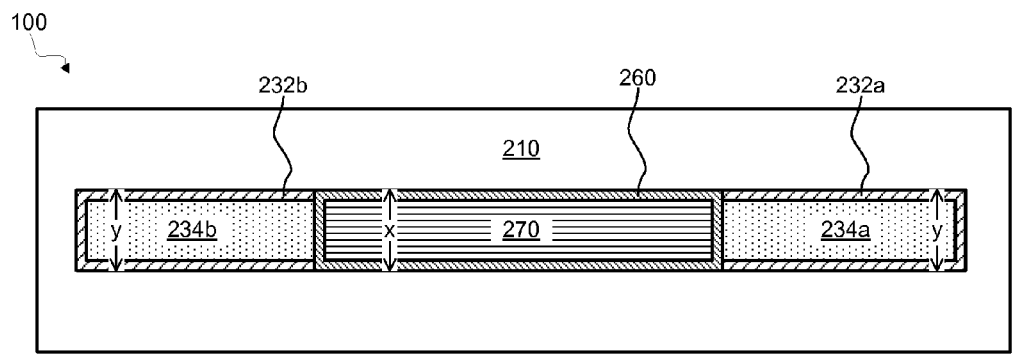
FIG. 2H is a top view depicting the formed graphene line of FIG. 2G, according to an exemplary embodiment of the present invention.
Figure 2I:
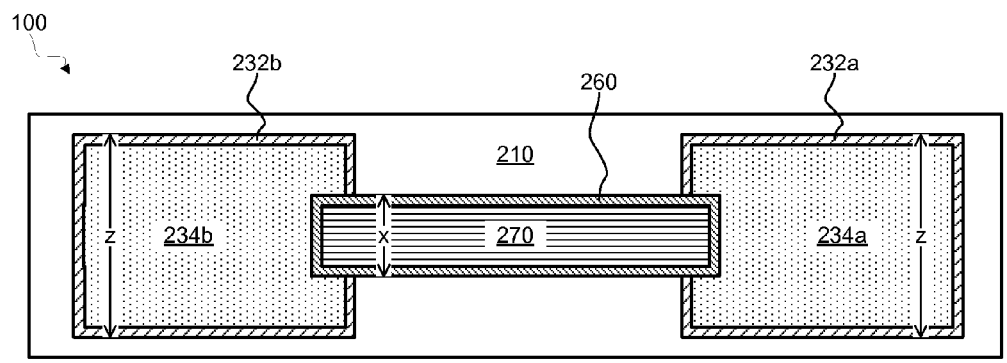
FIG. 2I is a top view depicting the formed graphene line of FIG. 2G, according to an exemplary embodiment of the present invention.

FIGS. 2H-2I depict top views of FIG. 2G, according to several embodiments of the present invention. Referring to FIG. 2H, the graphene line 270 may have a width x and the first $M_{x+1}$ metal 234a and the second $M_{x+1}$ metal 234b may have a width of y, where x and y are approximately equal. In an exemplary embodiment, x may range from approximately 5 nm to approximately 40 nm and y may range from approximately 5 nm to approximately 40 nm. However, embodiments where the graphene line 270, the first $M_{x+1}$ metal 234a, and the second $M_{x+1}$ metal 234b have greater or lesser widths are explicitly contemplated.

Due to the potentially greater conductivity of the graphene line 270, the first $M_{x+1}$ metal 234a and the second $M_{x+1}$ metal 234b may restrict the flow of current through the $M_{x+1}$ level 201 in embodiments where the first $M_{x+1}$ metal 234a and the second $M_{x+1}$ metal 234b have approximately the same width as the graphene line 270. To improve current flow, in some embodiments the graphene line 270 may have a width x and the first $M_{x+1}$ metal 234a and the second $M_{x+1}$ metal 234b may have a width of z, where z is greater than x. In some embodiments z may range from approximately 100% to approximately 300% of x. In an exemplary embodiment where z is approximately 300% of x, x may range from approximately 5 nm to approximately 40 nm and z may range from approximately 15 nm to approximately 120 nm, although greater and lesser widths are explicitly contemplated.

Figure 3:
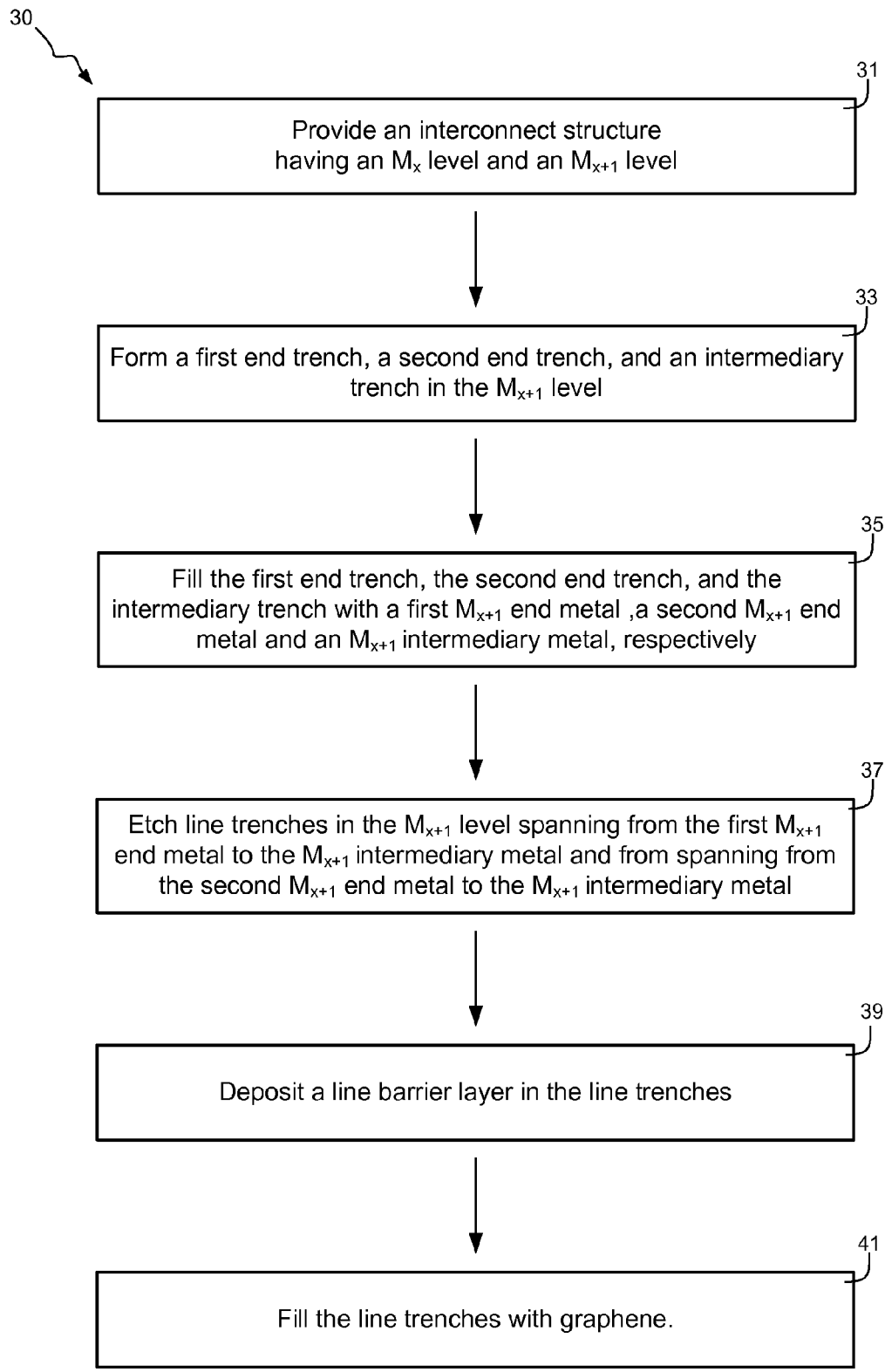
FIG. 3 is a flow chart of a method of forming a hybrid graphene-metal interconnect structure, according to another exemplary embodiment of the present invention.

FIG. 3 is a flow chart of a method of forming a hybrid graphene-metal line, according to an embodiment of the present invention. The hybrid graphene-metal line includes two metal ends and at least one intermediate metal connected to the metal ends by graphene lines. By controlling the lengths of the graphene lines and the intermediate metals, the overall performance of the hybrid graphene-metal line may be increased.

Referring to FIG. 3, the method 30 includes a step 31, providing an interconnect structure including an $M_x$ level and an $M_{x+1}$ level; a step 33, forming a first end trench, a second end trench, and an intermediary trench in the $M_{x+1}$ level; a step 35, filling the first end trench, the second end trench, and the intermediary trench with a first $M_{x+1}$ end metal, a second $M_{x+1}$ end metal and an $M_{x+1}$ intermediary metal, respectively; a step 37, etching line trenches in the $M_{x+1}$ level spanning from the first $M_{x+1}$ end metal to the $M_{x+1}$ intermediary metal and from spanning from the second $M_{x+1}$ end metal to the $M_{x+1}$ intermediary metal; a step 39, depositing line barrier layers in the line trenches; and a step 41, filling the line trenches with graphene.

At 31, the interconnect structure 100 described above in conjunction with FIG. 4A may be provided.

At 33, described in conjunction with FIG. 4A, a first end trench 420a, a second end trench 420b, and an intermediate trench 420c may be formed in the $M_{x+1}$ level 201. The first end trench 420a and the second end trench 420b may be formed by substantially the same methods as the first trench 220a (FIG. 2B) and the second trench 220b (FIG. 2B). The intermediate trench 420c may be formed in the $M_{x+1}$ level 201 between the first end trench 420a and the second end trench 420b using, for example, a dual damascene process.

Figure 4B:
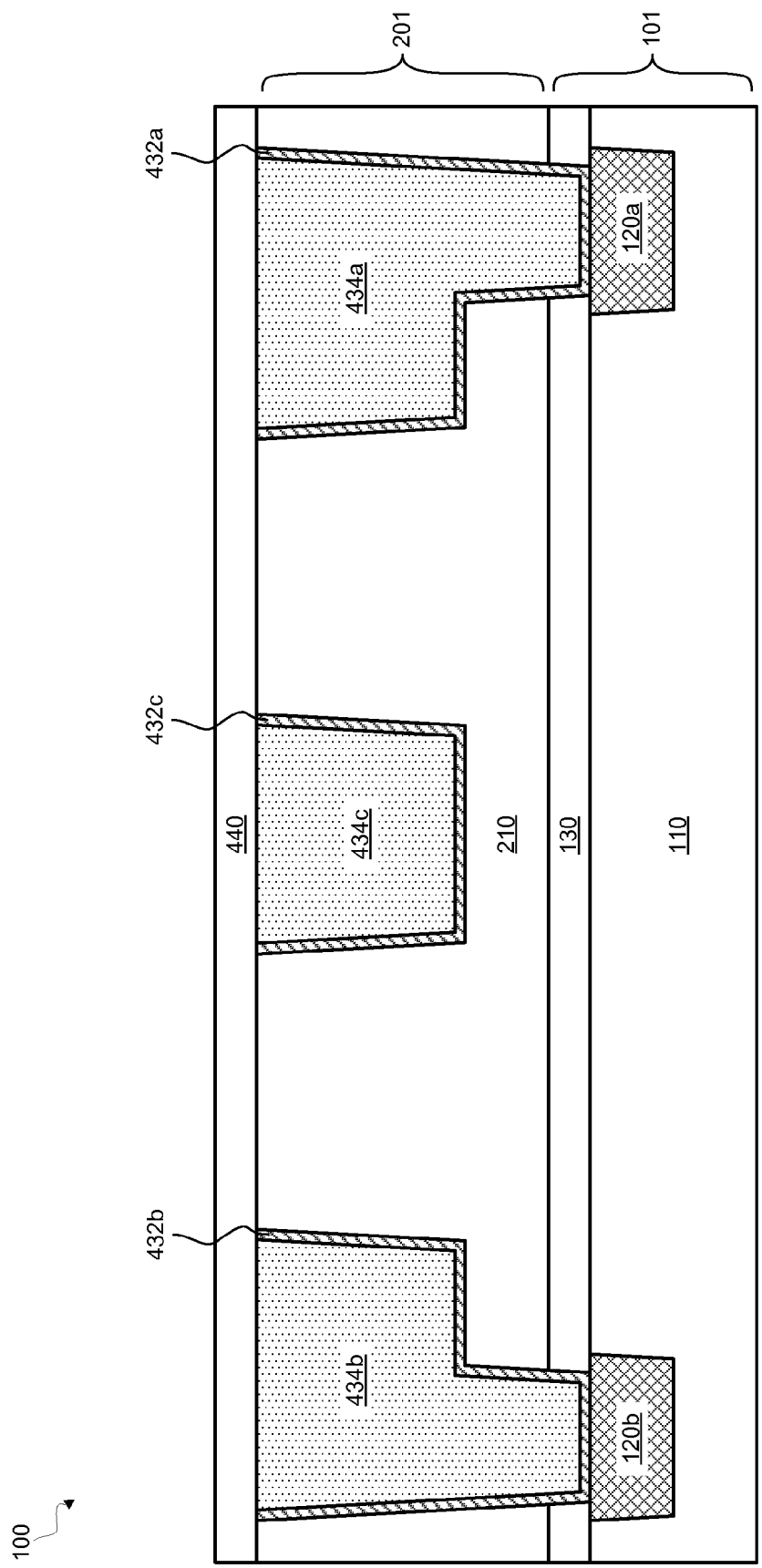
FIG. 4B is a cross-sectional view depicting forming a first $M_{x+1}$ end metal in the first end trench of the $M_{x+1}$ level, a second $M_{x+1}$ end metal in the second end trench of the $M_{x+1}$ level, an $M_{x+1}$ intermediate metal in the intermediate trench of the $M_{x+1}$ level, and an $M_{x+1}$ capping layer above the $M_{x+1}$ dielectric according to an exemplary embodiment of the present invention.

At 35, described in conjunction with FIG. 4B, a first $M_{x+1}$ end metal 434a, a second $M_{x+1}$ end metal 434b, and an $M_{x+1}$ intermediate metal 434c may be formed in the first end trench 420a, the second end trench 420b, and the intermediate trench 420c respectively. The first $M_{x+1}$ end metal 434a, the second $M_{x+1}$ end metal 434b, and the $M_{x+1}$ intermediate metal 434c may be made of substantially the same materials and formed by substantially the same methods as the first $M_{x+1}$ metal 234a and a second $M_{x+1}$ metal 234b.

With continued reference to FIG. 4B, liners 432a-432c may be formed in the first end trench 420a, the second end trench 420b, and the intermediate trench 420c, respectively, prior to forming, the first $M_{x+1}$ end metal 434a, the second $M_{x+1}$ end metal 434b, and the $M_{x+1}$ intermediate metal 434c. Liners 432a-432c may be made of substantially the same materials and formed by substantially the same methods as liners 232a and 232b.

With continued reference to FIG. 4B, a sacrificial protective layer 440 may be formed above the $M_{x+1}$ level 201. The sacrificial protective layer 440 may be made of substantially the same materials and formed by substantially the same methods as the sacrificial protective layer 240.

Figure 4C:
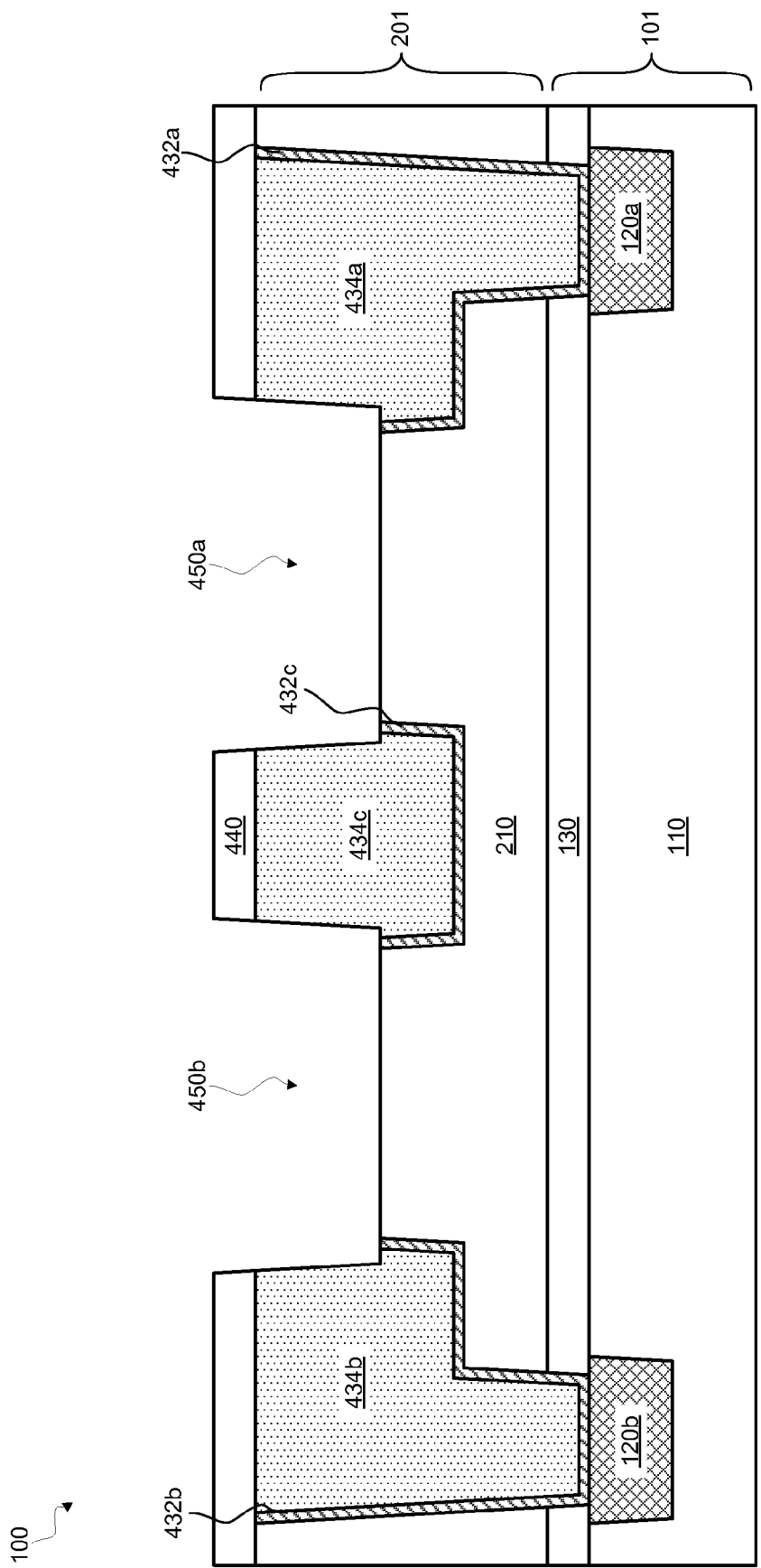
FIG. 4C is a cross-sectional view depicting etching a first $M_{x+1}$ line trench in the $M_{x+1}$ level between the first $M_{x+1}$ end metal and the $M_{x+1}$ intermediate metal and a second $M_{x+1}$ line trench in the $M_{x+1}$ level between the second $M_{x+1}$ end metal and the $M_{x+1}$ intermediate metal, according to an exemplary embodiment of the present invention.

At 37, described in conjunction with FIG. 4C, a first line trench 450a and a second line trench 450b may be formed in the $M_{x+1}$ level 201. The first line trench 450a may span the distance between the first $M_{x+1}$ end metal 434a and the $M_{x+1}$ intermediate metal 434c so that the first line trench 450a exposes a portion of the first $M_{x+1}$ end metal 434a and the $M_{x+1}$ intermediate metal 434c. The second line trench 450b may span the distance between the second $M_{x+1}$ end metal 434b and the $M_{x+1}$ intermediate metal 434c so that the first line trench 450b exposes a portion of the second $M_{x+1}$ end metal 434b and the $M_{x+1}$ intermediate metal 434c. The first line trench 450a and the second line trench 450b may have a depth ranging from approximately 25 nm to approximately 80 nm, measured from the top surface of the dielectric layer 210, although greater and lesser depths are explicitly contemplated. The first line trench 450a and the second line trench 450b formed by substantially the same methods as the line trench 250.

Figure 4D:
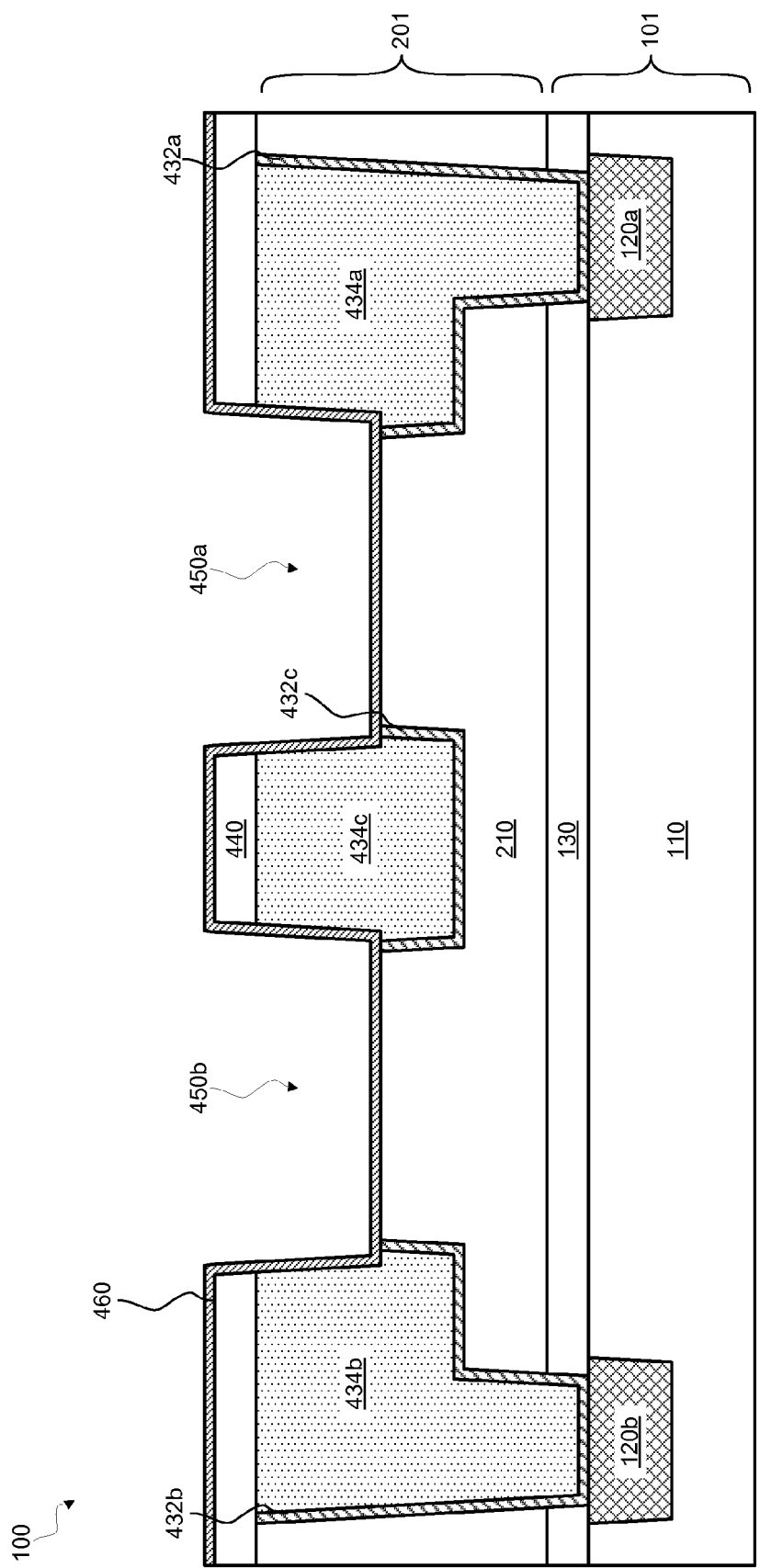
FIG. 4D is a cross-sectional view depicting depositing a line barrier layer in the first $M_{x+1}$ line trench and the second $M_{x+1}$ line trench, according to an exemplary embodiment of the present invention
Figure 4E:
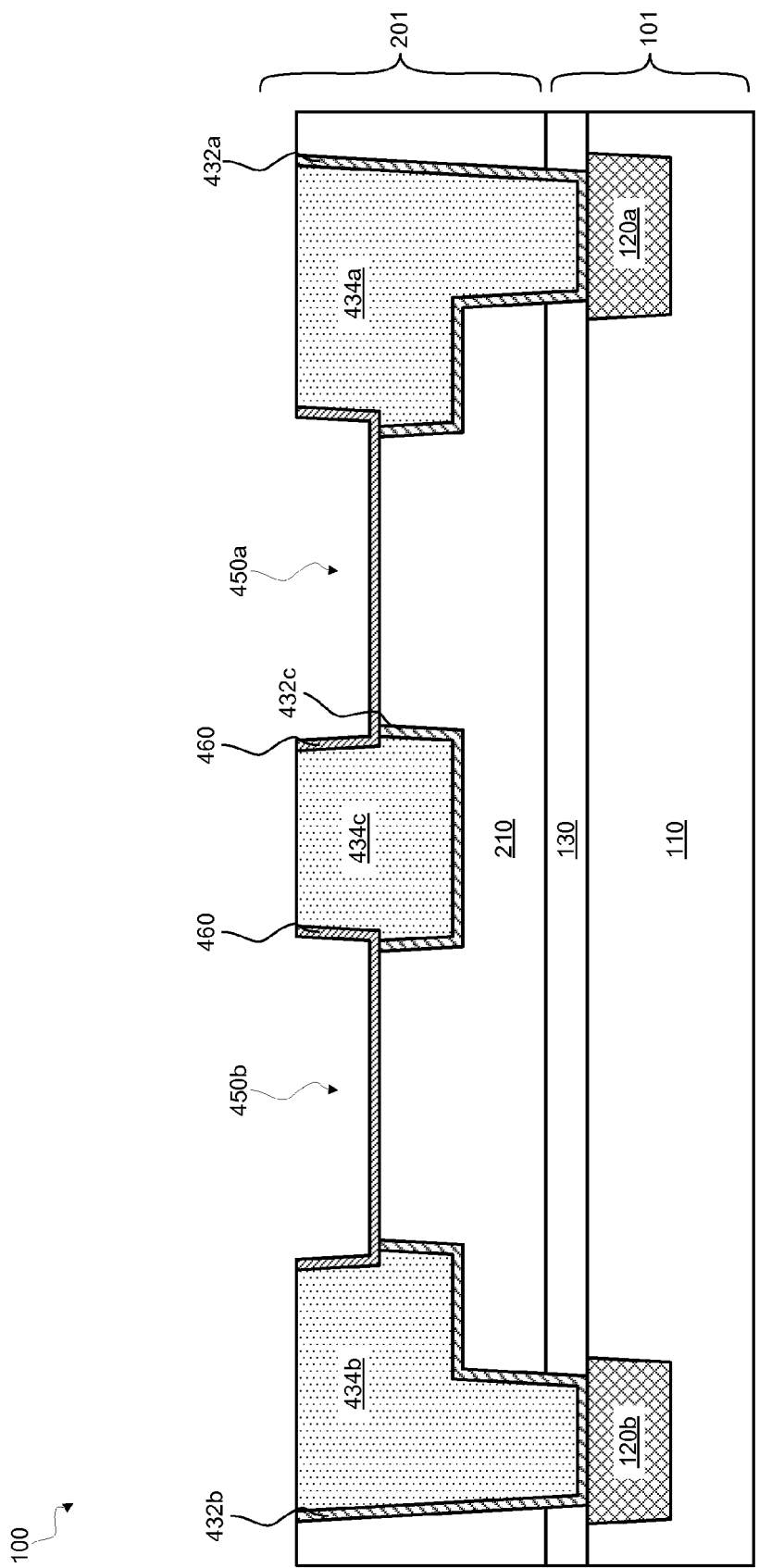
FIG. 4E is a cross-sectional view depicting planarizing the $M_{x+1}$ level, according to an exemplary embodiment of the present invention.

At 39, described in conjunction with FIG. 4D-4E, a line barrier layer 460 may be formed in the first line trench 450a and the second line trench 450b. The line barrier 460 may be made of substantially the same materials and formed by substantially the same methods as the line barrier layer 260.

Referring to FIG. 4E, the $M_{x+1}$ level 201 may be planarized using, for example, chemical-mechanical planarization (CMP) to remove excess material from the line barrier layer 460 and the sacrificial protective layer 440. The CMP process may use the first $M_{x+1}$ end metal 434a the second $M_{x+1}$ end metal 434b, and the $M_{x+1}$ intermediate metal 434c as a planarization stop, though some amount of overpolishing, resulting in removal of a top portion of first $M_{x+1}$ end metal 434a, the second $M_{x+1}$ end metal 434b, and the $M_{x+1}$ intermediate metal 434c may be acceptable. After planarization, the depth of the line trenches 450a-450b may be reduced to approximately 2 nm to approximately 5 nm, including the thickness of the barrier layer 460, although greater and lesser depths are explicitly contemplated.

Figure 4F:
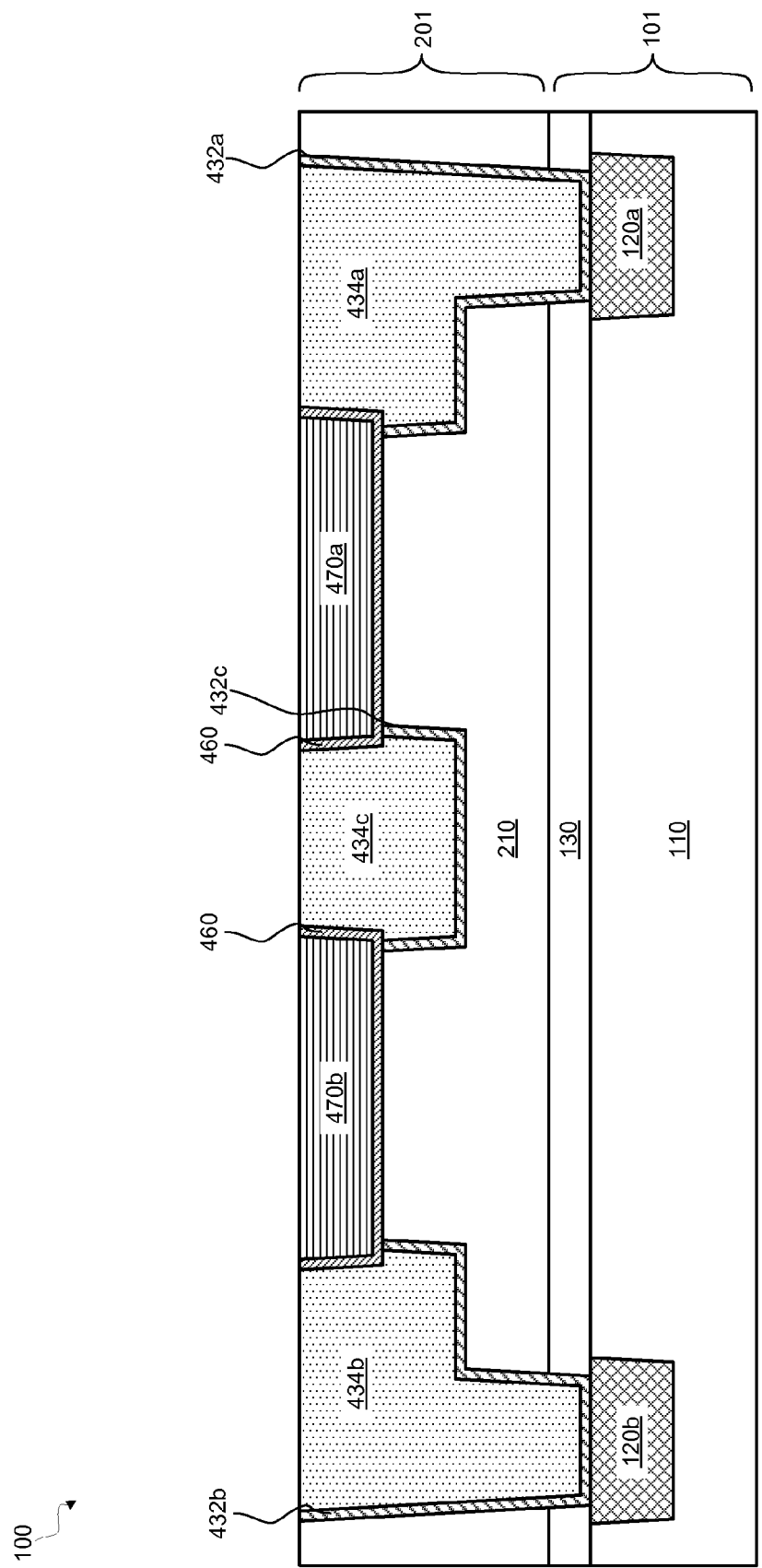
FIG. 4F is a cross-sectional view depicting filling the first $M_{x+1}$ line trench and the second $M_{x+1}$ line trench with graphene, according to an exemplary embodiment of the present invention.

At 41, described in conjunction with FIG. 4F, graphene lines 470a-470b may be formed in the first line trench 450a and the second line trench 450b, so that the graphene lines 470a-470b abut and are electrically connected to the $M_{x+1}$ end metal 434a the second $M_{x+1}$ end metal 434b, and the $M_{x+1}$ intermediate metal 434c while being separated from $M_{x+1}$ end metal 434a the second $M_{x+1}$ end metal 434b, and the $M_{x+1}$ intermediate metal 434c by the line barrier layer 460. The graphene lines 470a-470b may be made of substantially the same materials and formed by substantially the same methods as the graphene line 270.

After forming the graphene lines 470a-470b, an $M_{x+1}$ capping layer (not shown) and an $M_{x+2}$ dielectric layer (not shown) may be deposited above the $M_{x+1}$ dielectric layer 210 and the process described above in conjunction with FIGS. 4A-4F may be repeated to form an $M_{x+2}$ level containing an additional hybrid graphene metal line. Because both ends of the hybrid graphene metal line of the $M_{x+1}$ level 201 are metals (i.e., the first $M_{x+1}$ end metal 434a and the second $M_{x+1}$ end metal 434b), it may be possible to avoid making any electrical connections to the graphene lines 470a-470b.

Instead, electrical connections from the $M_{x+2}$ level may be made to the first $M_{x+1}$ end metal 434a and the second $M_{x+1}$ end metal 434b.

Figure 4G:
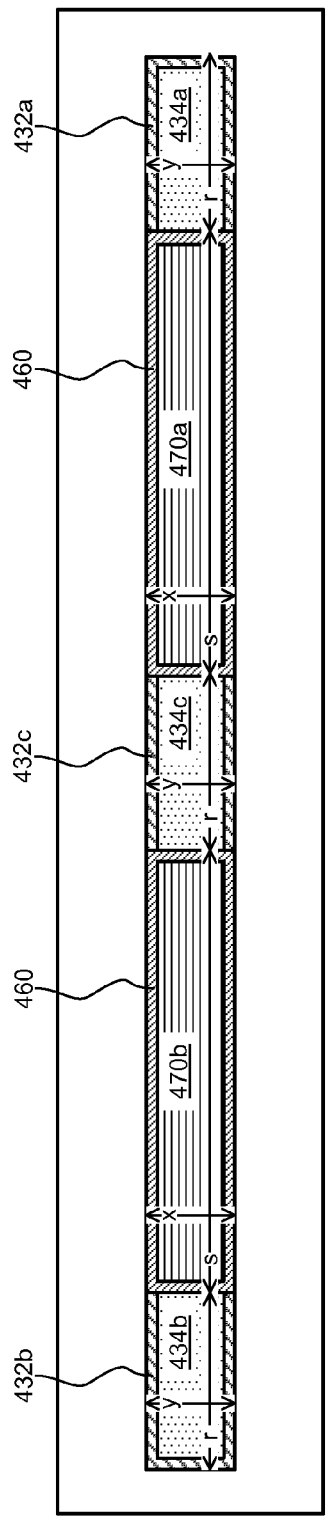
FIG. 4G is a top view depicting the formed hybrid graphene-metal line of FIG. 4F, according to an exemplary embodiment of the present invention.
Figure 4H:
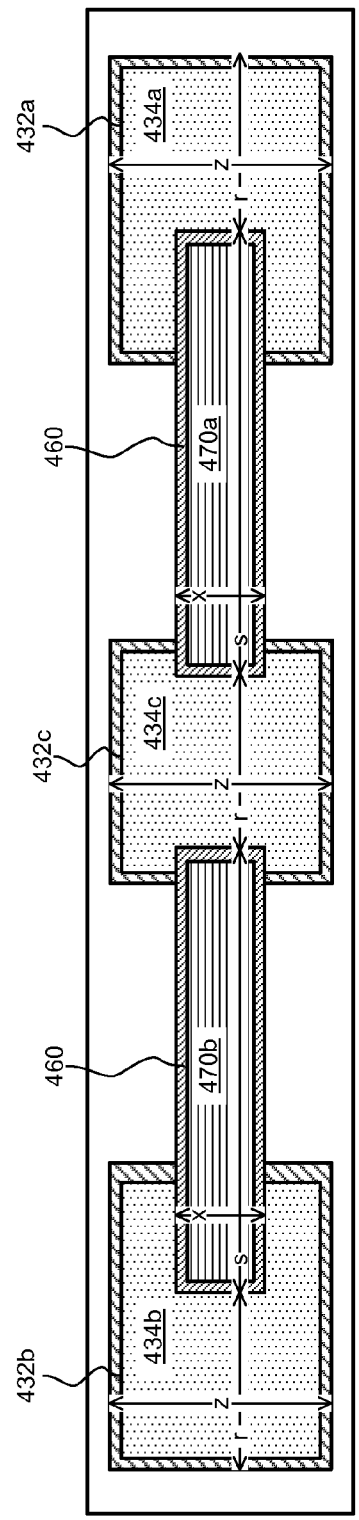
FIG. 4H is a top view depicting the formed hybrid graphene-metal line of FIG. 4F, according to an exemplary embodiment of the present invention.

FIGS. 4G-4H depict top views of FIG. 4F, according to several embodiments of the present invention. Referring to FIG. 4G, the first $M_{x+1}$ end metal 434a, the second $M_{x+1}$ end metal 434b, and the $M_{x+1}$ intermediate metal 434c may have the same width y as the first $M_{x+1}$ metal 234a and the second $M_{x+1}$ metal 234b, and the graphene lines 470a-470b may have the same width x as the graphene line 270, as depicted in FIG. 2H. Referring to FIG. 4H, the first $M_{x+1}$ end metal 434a, the second $M_{x+1}$ end metal 434b, and the $M_{x+1}$ intermediate metal 434c may have the same width z as the first $M_{x+1}$ metal 234a and the second $M_{x+1}$ metal 234b, and the graphene lines 470a-470b may have the same width x as the graphene line 270, as depicted in FIG. 2I.

With continued reference to FIGS. 4G-4H, the first $M_{x+1}$ end metal 434a, the second $M_{x+1}$ end metal 434b, and the $M_{x+1}$ intermediate metal 434c may have a length r and the graphene lines 470a-470b may have a length s. In some embodiments, the lengths r and s may be optimized to improve the reliability of the interconnect structure 100. For example, one potential issue with metal lines in interconnect structure is electromigration, where the force generated by current flowing through a metal results in distortion of the metal. However, there is a critical length, or electromigration threshold length, below which the effects of electromigration may be negligible in a metal line. By keeping the length r below this critical length, the impact of electromigration on the first $M_{x+1}$ end metal 434a, the second $M_{x+1}$ end metal 434b, and the $M_{x+1}$ intermediate metal 434c may be reduced. Further, typical graphene deposition or growth processes may have an increased defect concentration as the length of the graphene layer increases. By controlling the length s, it may be possible to maintain defect levels in the graphene lines 470a-470b below a desired concentration. In an exemplary embodiment, r may be approximately 5 µm to approximately 20 µm and s may be approximately 1 µm to approximately 10 µm, though greater and lesser lengths are explicitly contemplated.

Figure 5:
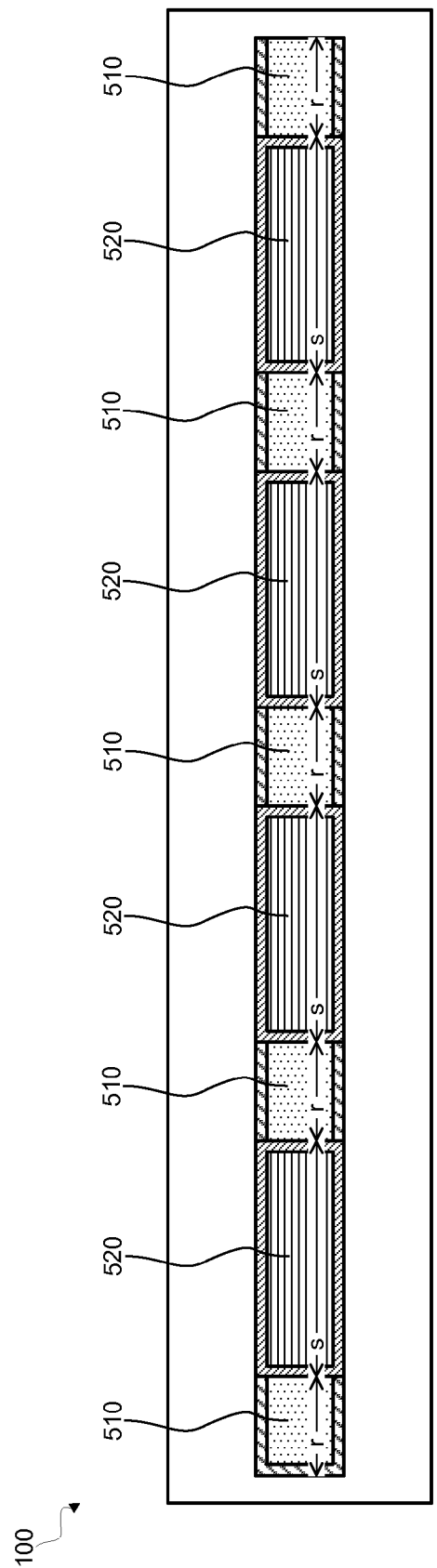
FIG. 5 is a top view depicting a hybrid graphene line including a plurality of metal portions and a plurality of graphene portions, according to an exemplary embodiment of the present invention.

Referring to FIG. 5, in further embodiments, a hybrid graphene-metal interconnect structure 500 may be formed including a plurality of metal portions 510 and a plurality of graphene portions 520 connecting the plurality of metal portions 510. The plurality of metal portions will include a first end metal substantially similar to the first $M_{x+1}$ end metal 434a (FIG. 4F), a second end metal substantially similar to the second $M_{x+1}$ end metal 434b (FIG. 4F), and one or more intermediate metals substantially similar to the $M_{x+1}$ intermediate metal 434c (FIG. 4F). Each of the plurality of graphene portions 520 will be substantially similar to the graphene lines 470a-470b. By increasing the number of intermediate metals in the plurality of metal portions and increasing the number of the plurality of graphene portions 520 while maintaining a length r for each of the plurality of metal portions 510 and a length s for each of the plurality of graphene portions 520, it may be possible to fabricate a hybrid graphene-metal line of any length while reducing the impact of electromigration in the metal portions and controlling the defect concentration in the plurality of graphene portions 520.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein. It is therefore intended that the present invention not be limited to the exact forms and details described and illustrated but fall within the scope of the appended claims.

What is claimed is:

1. A method of forming an interconnect structure, the method comprising:
    forming a plurality of metals in a dielectric layer, wherein the plurality of metals comprises a first end metal and a second end metal;
    forming a line trench in the dielectric between each of the plurality of metals to expose a sidewall of the first end metal and a sidewall of the second end metal;
    forming a line barrier layer in the line trench and in contact with at least the sidewall of the first end metal, the sidewall of the second end metal, and the dielectric layer; and
    filling the line trench with graphene.

2. The method of claim 1, wherein the line barrier layer comprises a barrier material selected from the group consisting of tantalum, tantalum nitride, titanium, and titanium nitride, and a graphene seed material selected from the group consisting of ruthenium, nickel, palladium, iridium, and copper.

3. The method of claim 1, wherein filling the line trench with graphene comprises using a chemical vapor deposition process to deposit multilayer graphene in the line trench.

4. The method of claim 3, wherein the chemical vapor deposition process occurs at approximately 300° C. and approximately 400° C.

5. The method of claim 1, further comprising planarizing the dielectric layer after forming the line barrier layer to reduce the depth of the line trench to approximately 2 nm to approximately 5 nm.

6. The method of claim 1, wherein the plurality of metals further comprises one or more intermediate metals between the first end metal and the second end metal.

7. The method of claim 6, wherein the length of the one or more intermediate metals is less than the electromigration threshold length.

* * * * *